(12) United States Patent
Houle

(10) Patent No.: US 6,773,963 B2
(45) Date of Patent: Aug. 10, 2004

(54) APPARATUS AND METHOD FOR CONTAINING EXCESS THERMAL INTERFACE MATERIAL

(75) Inventor: Sabina J. Houle, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/053,370

(22) Filed: Jan. 16, 2002

(65) Prior Publication Data

US 2003/0134454 A1 Jul. 17, 2003

(51) Int. Cl.⁷ .............................................. H01L 21/44
(52) U.S. Cl. ....................... 438/122; 438/119; 257/707; 257/719; 257/712
(58) Field of Search ............................ 438/122, 119; 257/707, 706, 712, 713, 719

(56) References Cited

U.S. PATENT DOCUMENTS

| | | | |
|---|---|---|---|
| 4,708,849 A | * 11/1987 | Mielnik, Jr. et al. | 228/246 |
| 4,817,854 A | * 4/1989 | Tihanyi et al. | 228/124 |
| 5,223,741 A | * 6/1993 | Bechtel et al. | 257/678 |
| 5,829,516 A | * 11/1998 | Lavochikin | 165/80.4 |
| 5,913,108 A | * 6/1999 | Stephens et al. | 438/109 |
| 6,281,573 B1 | * 8/2001 | Atwood et al. | 257/706 |
| 6,344,686 B1 | * 2/2002 | Schaeffer et al. | 257/712 |
| 6,504,242 B1 | * 1/2003 | Deppisch et al. | 257/707 |
| 6,607,942 B1 | 8/2003 | Tsao et al. | 438/122 |

FOREIGN PATENT DOCUMENTS

| | | | | |
|---|---|---|---|---|
| JP | 51033988 A | * | 3/1976 | H01L/23/14 |
| JP | 53011591 A | * | 2/1978 | H01L/21/58 |
| JP | 01286349 A | * | 11/1989 | 257/714 |
| JP | 05226782 A | * | 9/1993 | H01S/3/18 |
| JP | 09275170 A | * | 10/1997 | H01L/23/373 |
| JP | 0912358 A | | 12/1997 | |
| JP | 10270614 A | * | 10/1998 | H01I/23/36 |

* cited by examiner

Primary Examiner—Caridad Everhart
(74) Attorney, Agent, or Firm—Kenyon & Kenyon

(57) ABSTRACT

A semiconductor package is provided. The semiconductor package includes a semiconductor device supported by a substrate. The package also includes a heat spreader having a surface divided into a central area and a channel. The channel is recessed relative to said die area. The package also includes a thermal interface material layer disposed between the semiconductor device and the surface of the heat spreader to provide thermal conductivity between the semiconductor device and the heat spreader.

26 Claims, 5 Drawing Sheets

APPARATUS AND METHOD FOR CONTAINING EXCESS THERMAL INTERFACE MATERIAL

BACKGROUND OF THE INVENTION

1. Field of the Invention

The present invention relates to semiconductor manufacturing technology generally, and more particularly, to containing thermal interface material in heat spreader technology for heat dissipation in a semiconductor package.

2. Description of the Related Art

Semiconductor technology may be characterized as a quest to place more transistors on less space to achieve greater speed and performance. As integrated circuits and other semiconductor devices become faster, operating frequencies (i.e. clock speed in a microprocessor) also increase. At the same time, engineers and developers also strive to construct semiconductor devices that are more compact, therefore the distances between the conductive lines within the semiconductor device are being decreased accordingly.

As the density of conductive lines in and the clock speed of circuits increase, the amount of heat generated by the device also increases. Unfortunately, device reliability and performance decrease as the amount of heat increases, whether the heat is generated by the device or from other sources. In addition, semiconductor devices are prone to overheating, which is a point of heat tolerance past which, the device will fail and be unable to operate. Therefore, it is critical to have an efficient heat-removal system associated with integrated circuits. One conventional method to remove heat from a chip package is by using a heat spreader, which may also be used in combination with a second level solution.

FIG. 1 illustrates a conventional chip package 10. Chip package 10 includes a chip die 12 supported by a substrate 14. Substrate 14 is also able to support other various circuit components, such as capacitors 16. Chip package 10 also includes a heat spreader 18, which is coupled to chip die 12 through a thermal conductor known as a thermal interface material (TIM) layer 20. Heat spreader 18 is also attached to substrate 14 using a sealant 22. A second level solution, such as a heat sink (not illustrated) may also be coupled to heat spreader 18 to absorb heat generated from the circuitry in chip package 10.

Heat spreaders are becoming more and more important in semiconductor technology, particularly because semiconductor devices, including chip package 10, continue to become more compact. As devices continue to decrease in size, the performance of heat spreaders must continue to improve. Therefore, it is important to evenly distribute heat generated by chip package 10, which is the function of heat spreader 18, which typically comprises a ceramic material or a metal, such as aluminum or copper. Heat spreader 18 is coupled to chip die 12 and capacitors 16 through TIM layer 20.

Examples of TIM include polymer gel, grease or polymer/solder hybrid containing metal particles to improve heat conduction. Using a or solder in TIM layer 20 results in improved thermal conductivity, which is important for future microprocessors, which will generate even more heat. However, a disadvantage of using solder or a stiffer polymer in the TIM occurs in the process of forming the TIM itself. Unlike normal polymeric TIM, which is formed by curing and gelling, a solder or polymer/solder preform must be heated to form a liquid so that it may be evenly distributed on the bottom surface of heat spreader 18. However, during the time that the preform is in liquid form, it is difficult to control the flow of the thermal interface material.

FIG. 2 is a x-ray diagram illustrating a solder TIM layer 20 being formed in chip package 10. As described above, the preform solder is heated to form a liquid. After being heated, the liquid preform reflows to wet chip die 12 and cools to form TIM layer 20. Unfortunately, because the solder TIM assumes liquid form during the process and because the reflow is difficult to control, the liquid solder is likely to flow onto and build up on substrate 14 (illustrated in FIG. 1).

Often the reflow of liquid solder will enter areas reserved for other sensitive circuit components in chip package 10, such as capacitors 16. When the liquid TIM comes into contact with circuit components supported by substrate 14, the capacitors 16 will likely short circuit, leading to failure of chip package 10. In addition, the build up of excess TIM on substrate 14 may cause stress concentrations. The excess TIM may expand and contract, initiating cracks in substrate 14 on either the die to solder interface or the heat spreader to solder interface, resulting in a reduction in thermal performance.

In view of the foregoing, what is needed is a method and apparatus providing for the rapid dissipation of heat through a thermal interface material to a heat spreader. It is also desirable to provide for beading TIM evenly on a substrate surface and to prevent excess TIM from flowing into contact with sensitive parts of a chip package.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

A method and apparatus to contain excess thermal interface material for a semiconductor chip package is provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
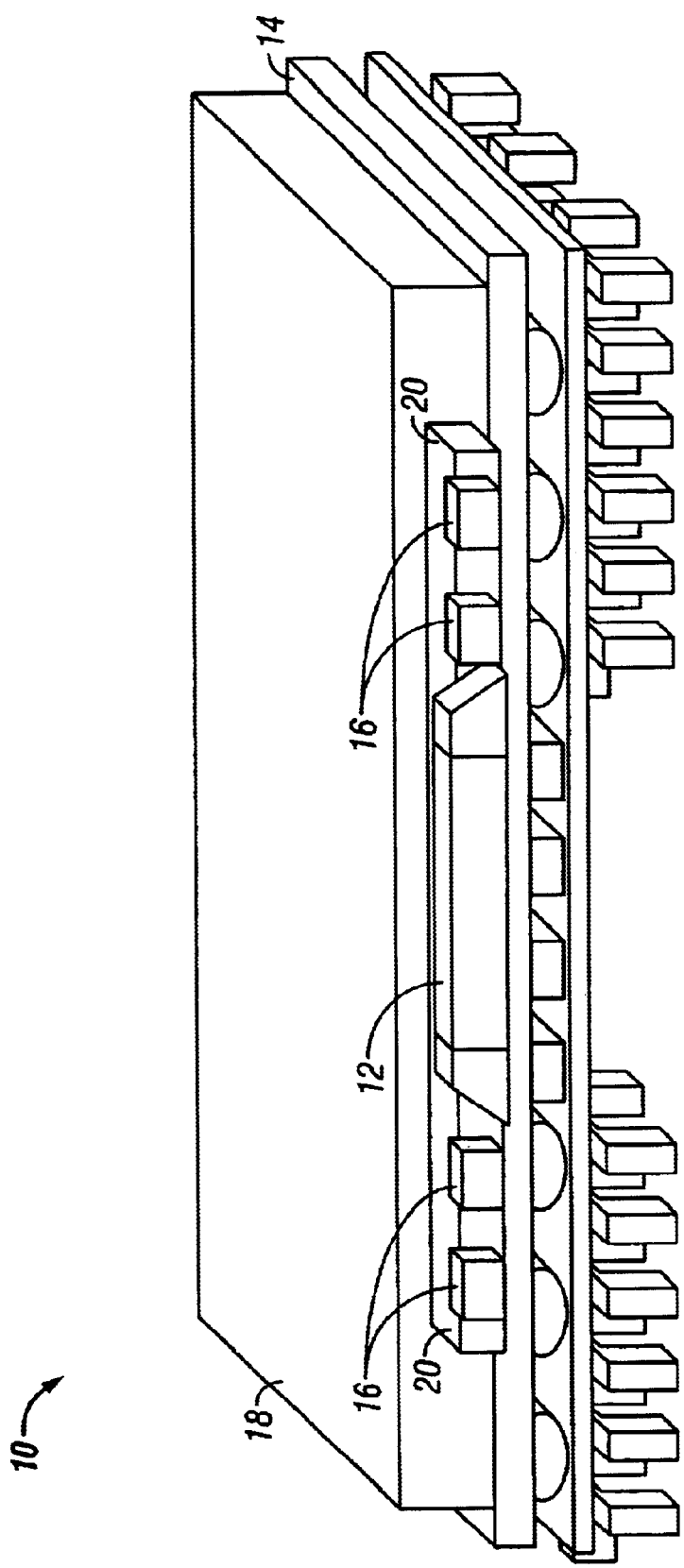
FIG. 1 illustrates a conventional chip package.
Figure 2:
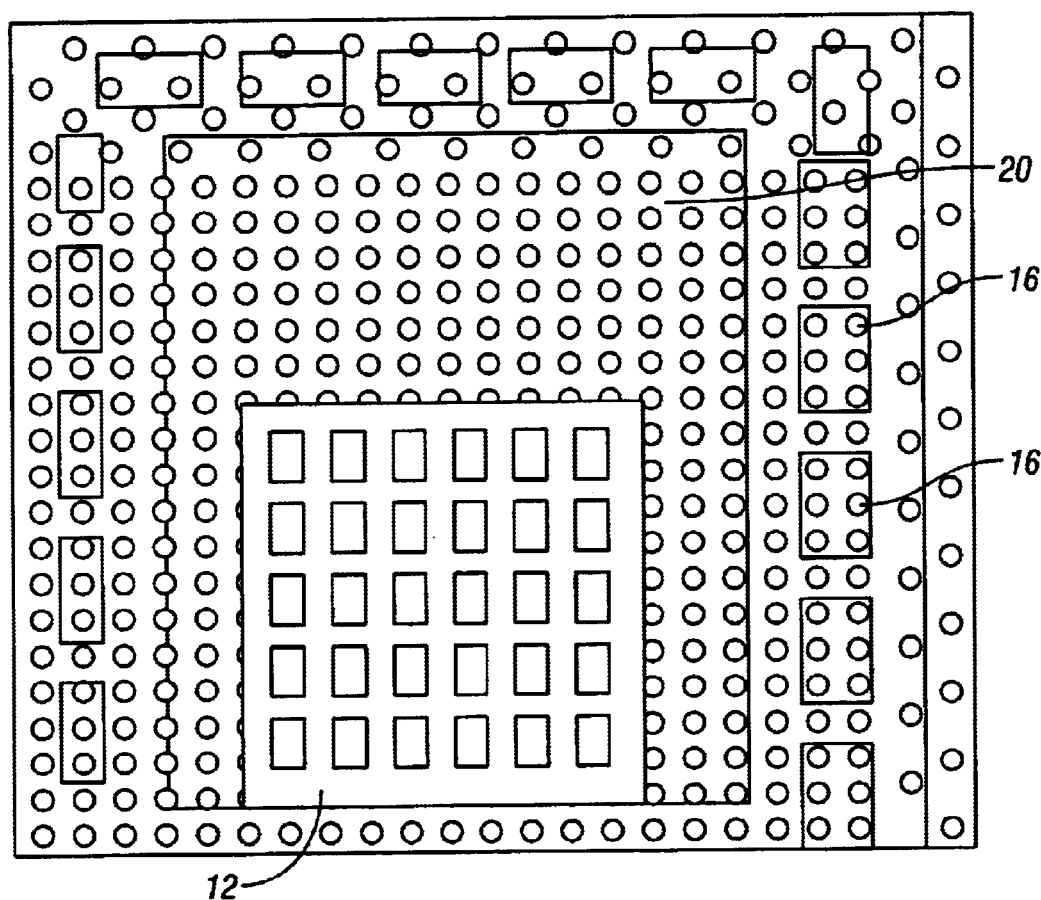
FIG. 2 is a x-ray diagram illustrating a TIM layer being formed in the chip package.
Figure 3:
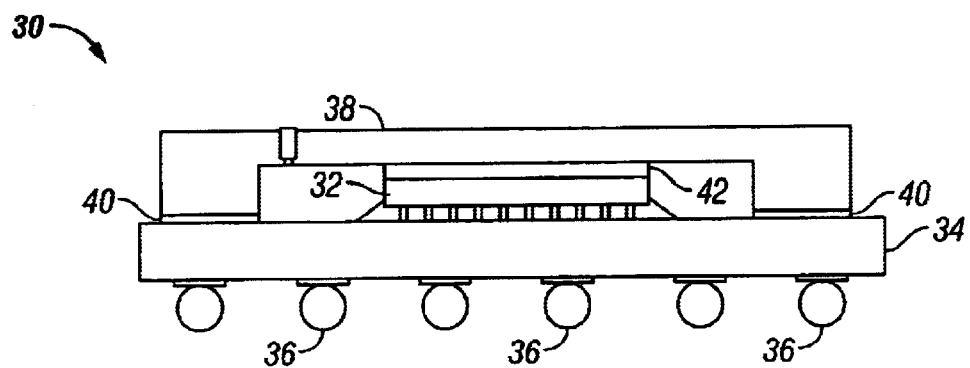
FIG. 3 illustrates a cross-sectional view of a semiconductor package in accordance with one embodiment of the present invention.

FIG. 3 illustrates a cross-sectional view of a semiconductor package 30 in accordance with one embodiment of the present invention. Semiconductor package 30 includes a semiconductor device 32, such as a chip die, supported by a substrate 34. Semiconductor device 32 is typically both mechanically and electrically coupled to the top surface of substrate 34. Substrate 34 also includes a wiring layer that electrically couples device 32 to a set of pins or balls 36 (i.e. in a pin grid array (PGA) or ball grid array (BGA)) located along the bottom surface of substrate 34. Examples of substrate 34 include a printed circuit board (PCB), silicon or ceramic.

An integrated heat spreader (IHS) 38 is attached to substrate 34 with a sealant 40, which may include silicone or other proprietary sealant material. IHS 38 is preferably formed from a carbon/carbon, carbon/metal matrix fiber reinforced composite, or metal (i.e. copper or aluminum coated with electrolytic nickel with gold above the die). The surface area of ISH 38 is preferably about 31 $mm^2$ to about 38 $mm^2$. IHS 38 may also be coupled to a second level solution, such as a heat sink (not illustrated). Sealant 40 surrounds device 32 and fills the gap between substrate 34 and IHS 38, forming a cavity-encapsulating device 32. The use of sealant 40 provides for a flexible bond between substrate 34 and IHS 38. Sealant 40 is preferably about 0.5 mils to about 9.0 mils in thickness (1 mil=25 microns).

IHS 38 is thermally coupled to semiconductor device 32 through a heat transfer medium known as a thermal interface material (TIM) layer 42. A direct connection between IHS 38 and semiconductor device 32 would result in poor contact and poor thermal conductivity. Therefore, TIM layer 42, which is malleable, is necessary to fill in the spatial voids and gaps between IHS 38 and device 32, providing good contact to both IHS 38 and device 32. A highly thermally conductive medium is thus provided as heat is transferred from device 32 to IHS 38 through TIM layer 42.

Examples of preferred materials that may be used to form TIM 42 include thermal grease or thermal gel, solder, polymer/solder or polymer. In particular, it has been discovered that TIM comprising solder (such as Indium) is optimal for thermal conductivity. During Tres performance testing with heater tracers, using solder TIM resulted in improved thermal removal. Assuming that TIM layer 42 comprises solder, it is therefore able to provide a superior heat transfer medium for and accommodate a microprocessor road map trending towards increased power consumption and power density.

Figure 4:
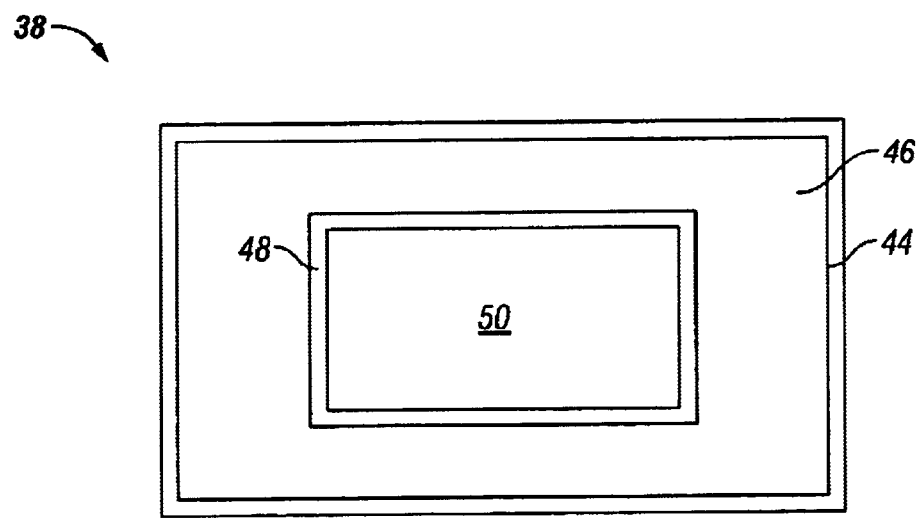
FIG. 4 illustrates a bottom surface of the integrated heat spreader in accordance with one embodiment of the present invention.

FIG. 4 illustrates a bottom surface of IHS 38 in accordance with one embodiment of the present invention. The surface area of ISH 38 is preferably about 31 $mm^2$ to about 38 $mm^2$. IHS 38 is preferably formed from copper, which has the best conductivity among IHS materials. IHS 38 includes a lip 44, an outer area 46, a trough or a channel 48, and a central area 50 (also referred to as a die area due to location semiconductor device 32). Lip 44 is preferably raised relative to a bottom surface of outer area 46 and die area 50. As shown in FIGS. 3 and 4, lip 44 is raised to couple to substrate 34 and encapsulate semiconductor device 32. Die area 50 is preferably large enough to provide a uniform IHS surface to receive heat from semiconductor device 32 through TIM layer 42. Die area 50 and other bottom surfaces of IHS 38 also preferably have a flatness of about 35 microns.

As described above with regard to dissipating heat from semiconductor device 32, the bottom surface of IHS 38 is thermally coupled to solder TIM layer 42, which functions as a heat transfer medium. Unlike a polymeric TIM, a TIM comprising solder starts as a preform, which is a piece of solder material, preferably having the dimensions of a square (i.e. 0.5 inches by 0.5 inches), preferably having a thickness of about 12 mils. The solder preform must be melted and cooled to solidify into a TIM layer 42 that completely wets device 32. The reflow process is necessary to eliminate bubbles and voids in solder TIM layer 42.

During this process, excess liquid solder may flow onto the substrate 34 causing a multitude of problems, including the shorting out of circuit components supported by substrate 34 and initiating cracks in substrate 34. Reducing the size of the solder preform to control this excess flow is not an acceptable solution because there would not be enough liquid solder to completely wet semiconductor device 32 and provide adequate thermal conductivity to IHS 38.

To resolve the overflow of liquid solder TIM, channel 48 is preferably recessed relative to the bottom surfaces of outer area 46 and die area 50 forming a trough or a cavity. Channel 48 is also preferably plated with a wetting layer of high surface energy material, such as gold over electrolytic nickel. The gold provides for superior wetting of channel 48 by attracting excess Indium solder that would otherwise spill onto substrate 34. Accordingly, channel 48 provides for containment of excess solder and prevents the solder from cracking substrate 34 or shorting out circuitry (typically capacitors) supported by substrate 34. Other high surface energy material such as silver may also be used to attract the excess solder in different areas of IHS 38, including die area 50.

It is important to note that in another embodiment of the present invention, semiconductor package 30 described in FIG. 3 may be flipped over so that substrate 34 is at the top of package 30 and IHS 38 is at the bottom. In the flipped package, the illustration of IHS 38 in FIG. 4 would then represent the top surface of the IHS instead of the bottom surface. Although it may be useful to have a wetting layer of high surface energy material on the top surface of an IHS in a flipped semiconductor package, it may also be possible to eliminate the wetting layer. If the wetting layer is not used, existing gravity could be used to draw excess TIM to the channel of the top surface of the IHS.

In yet another embodiment of the present invention, TIM comprising solder or a polymer/solder hybrid may be used to conduct heat between a IHS and a second level solution such as heat sink. The same principles for reflow could be applied to TIM disposed between an IHS and a heat pipe in mobile packages. The present invention may also be adopted to improve thermal conductivity between an IHS and a heat sink by creating a channel for overflow of excess TIM on the surface of the IHS, which faces the heat sink. As with previously described embodiments of the present invention, the channels may be stamped into the IHS to produce a low cost method of manufacturing the IHS. As is well known to the person of skill in the art, there are many methods that may be used to stamp features onto an IHS.

Figure 5A:
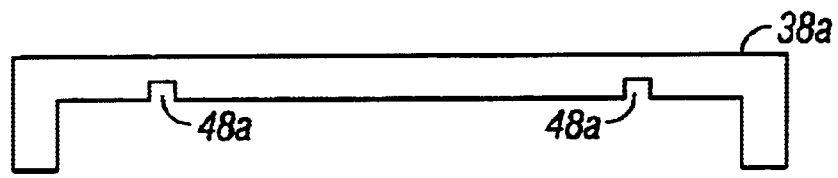
FIGS. 5A–5C are cross sectional views of a number of integrated heat spreaders in accordance with several embodiments of the present invention.
Figure 5B:
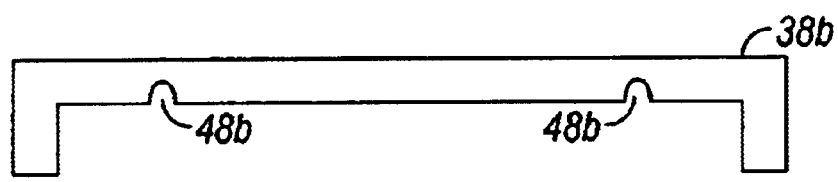
Figure 5C:
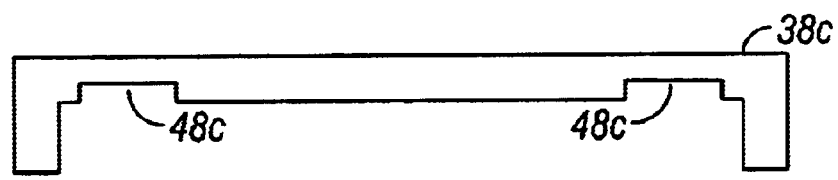

FIGS. 5A–5C are cross sectional views of integrated heat spreaders 38a–c in accordance with several embodiments of the present invention. Each IHS 38a–c includes a different embodiment of the present invention, as indicated by channels 48a–c. As illustrated, an IHS channel may be square, rectangular, or even take the form of a semicircle. Channels have a preferable depth of between about 0.5 mils to about 5.0 mils deep. In addition, channels are also preferably between about 0.5 mils to about 5.0 mils wide, although the width is only limited by the width of the IHS. The bond line thickness (BLT) of IHSs 38a–c is preferably about 8 to about 15 mils thick.

Figure 6:
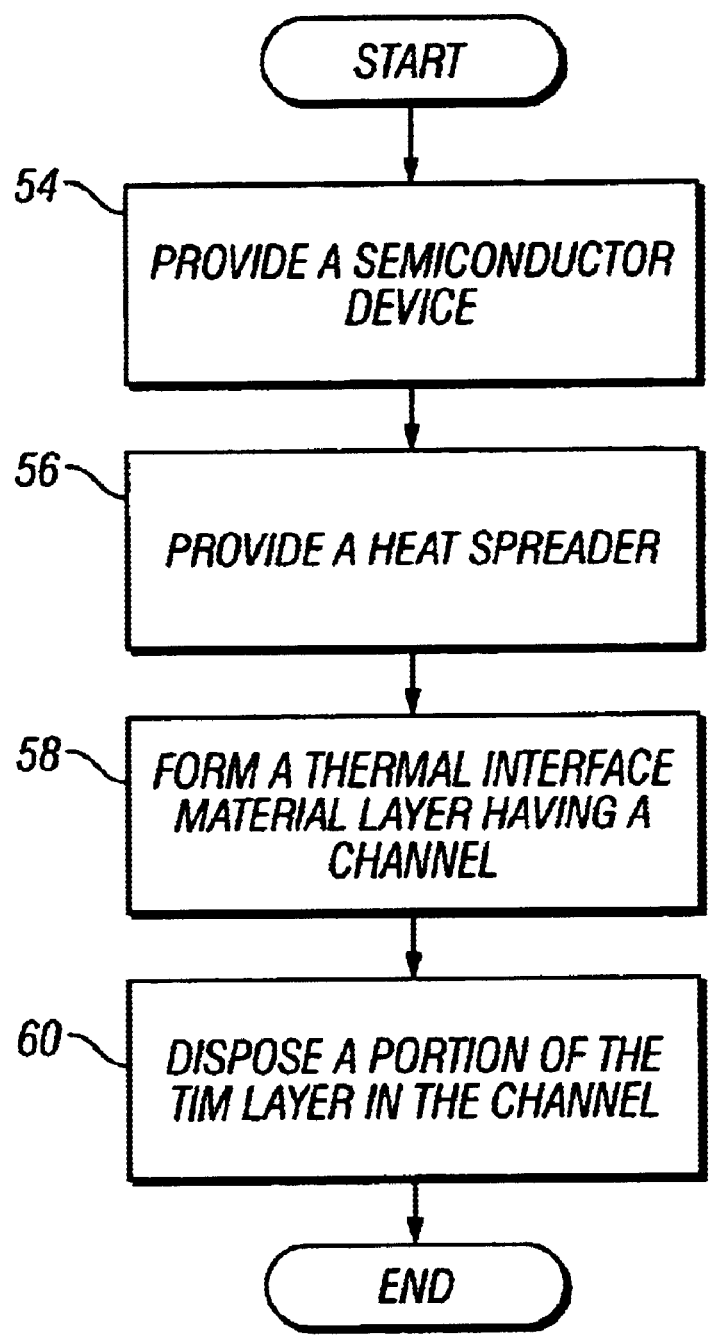
FIG. 6 is a flowchart of a method for containing excess solder TIM in a semiconductor package.

FIG. 6 is a flowchart of a method 52 for containing excess solder TIM in a semiconductor package. Method 52 begins at a block 54 where a semiconductor device is provided. The semiconductor device is preferably attached to and supported by a surface of a substrate. Depending on the assembly of the semiconductor package, the surface may be on the top or the bottom of the substrate. A heat spreader, preferably comprising copper is provided in a block 56. The heat spreader preferably includes a surface having a die area and a channel. Again, the heat spreader surface may be on the top or bottom of the heat spreader depending on the surface of the substrate used to support the semiconductor package. The die area is preferably to be placed directly above the semiconductor device (chip die) and the channel is preferably recessed relative to the die area.

In block 58, a TIM layer is formed and then disposed between the semiconductor device and the heat spreader. The TIM layer preferably comprises solder, such as Indium, or a polymer/solder hybrid material. The TIM layer is preferably formed by melting the solder preform. An electric flux is preferably placed on both the semiconductor device and the heat spreader to improve wettability. In addition, the heat spreader, including the channel, is preferably plated with gold and electrolytic nickel, which attracts the solder TIM. A portion of the TIM layer is therefore disposed in the channel in a block 60 after melting, reflow, and solidification. A force from a clip from about 4 pounds per square foot to about 22 pounds per square foot is preferably applied to the IHS to aid the deposition of the TIM layer.

Other embodiments of the invention will be appreciated by those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A semiconductor package, comprising:
   a semiconductor device supported by a substrate;
   a heat spreader, wherein said heat spreader includes a surface having a central area and a channel, wherein said channel is recessed relative to said central area and plated with a wetting layer; and
   a thermal interface material layer disposed between said semiconductor device and said surface of said heat spreader, wherein said thermal interface material layer is to thermally couple said semiconductor device and said heat spreader.

2. A semiconductor package as recited in claim 1, wherein a portion of the thermal interface material layer is disposed within said channel.

3. A semiconductor package as recited in claim 2, wherein the thermal interface material layer comprises solder.

4. A semiconductor package as recited in claim 3, wherein the heat spreader comprises copper and the solder comprises Indium.

5. A semiconductor package as recited in claim 3, wherein the wetting layer comprises gold on electrolytic nickel.

6. A semiconductor package as recited in claim 5, wherein the channel has a width of between about 0.5 mils to about 5.0 mils and a depth of between about 0.5 mils to about 5.0 mils.

7. A semiconductor package as recited in claim 5, wherein the heat spreader is disposed above the semiconductor device.

8. A semiconductor package as recited in claim 5, wherein the heat spreader is disposed below the semiconductor device.

9. A semiconductor package as recited in claim 5, wherein the heat spreader is a heat pipe.

10. A method of forming a semiconductor package, comprising:
    providing a semiconductor device;
    providing a heat spreader, wherein a surface of said heat spreader includes a central area and a channel, wherein said channel is recessed relative to said central area and plated with a wetting layer; and
    forming a thermal interface material layer to be disposed between said semiconductor device and said surface of said heat spreader.

11. A method of forming a semiconductor package as recited in claim 10, wherein a portion of the thermal interface material layer is disposed in the channel.

12. A method of forming a semiconductor package as recited in claim 11, wherein the thermal interface material layer comprises solder and wherein the heat spreader comprises copper.

13. A method of forming a semiconductor package as recited in claim 12, wherein the wetting layer comprises gold and electrolytic nickel.

14. A method of forming a semiconductor package as recited in claim 13, further comprising placing an electric flux on the semiconductor device and the heat spreader.

15. A method of forming a semiconductor package as recited in claim 14, further comprising applying a force to the heat spreader towards the semiconductor device.

16. A heat removal package, comprising:
    a heat spreader, wherein said heat spreader includes a surface having a central area and a channel, wherein said channel is recessed relative to said central area and plated with a wetting layer; and
    a thermal interface material layer disposed between a heat sink and said surface of said heat spreader, wherein said thermal interface material layer is to thermally couple said heat sink and said heat spreader.

17. A heat removal package as recited in claim 16, wherein a portion of the thermal interface material layer is disposed within said channel.

18. A heat removal package as recited in claim 17, wherein the thermal interface material layer comprises solder.

19. A heat removal package as recited in claim 18, wherein the solder is Indium.

20. A heat removal package as recited in claim 18, wherein the wetting layer comprises gold on electrolytic nickel.

21. A heat removal package as recited in claim 20, wherein the channel has a width of between about 0.5 mils to about 5.0 mils and a depth of between about 0.5 mils to about 5.0 mils.

22. An integrated heat spreader, comprising:
    a surface having a central area and a channel, the channel to be recessed relative to the central area and plated with a wetting layer, the surface to be thermally coupled to a heat sink by a thermal interface material layer.

23. An integrated heat spreader as recited in claim 22, wherein a portion of the thermal interface material layer is disposed within the channel.

24. An integrated heat spreader as recited in claim 22, wherein the thermal interface material layer comprises solder.

25. An integrated heat spreader as recited in claim 22, wherein the wetting layer comprises gold on electrolytic nickel.

26. An integrated heat spreader as recited in claim 22, wherein the channel has a width of between about 0.5 mils to about 5.0 mils and a depth of between about 0.5 mils to about 5.0 mils.

* * * * *